(12) United States Patent
Tsukuda (10) Patent No.: US 7,683,627 B2
(45) Date of Patent: Mar. 23, 2010

(54) SEMICONDUCTOR DEVICE HAVING A FUNCTION OF DETECTION BREAKAGES ON A PERIPHERY THEREOF

(75) Inventor: Masayuki Tsukuda, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 222 days.

(21) Appl. No.: 11/826,186

(22) Filed: Jul. 12, 2007

(65) Prior Publication Data

US 2008/0012572 A1 Jan. 17, 2008

(30) Foreign Application Priority Data

Jul. 13, 2006 (JP) .............................. 2006-193013

(51) Int. Cl.
*G01R 31/08* (2006.01)
(52) U.S. Cl. ...................................... 324/522; 324/719
(58) Field of Classification Search ................ 324/522, 324/713, 714, 717–719
See application file for complete search history.

(56) References Cited

FOREIGN PATENT DOCUMENTS

| JP | 07-193108 | 7/1995 |
|---|---|---|
| JP | 2000-031230 | 1/2000 |
| JP | 2005-277338 | 10/2005 |

*Primary Examiner*—Vincent Q Nguyen
(74) *Attorney, Agent, or Firm*—McGinn IP Law Group, PLLC (57) ABSTRACT

A resistance wiring and a judgement circuit for judging a potential in a middle of a path of the resistance wiring are provided on a periphery of a semiconductor chip. One end of the resistance wiring is connected to a power supply and the other end thereof is grounded. Connection points of the resistance wiring to the power supply and the ground are disposed at a corner on the periphery of the semiconductor chip, while a connection point of the resistance wiring to the judgement circuit is disposed at a corner diagonal to the corner on the periphery. When breakages such as chipping and peeling of an interlayer insulating film is caused on the periphery, resistance of the resistance wiring changes.

10 Claims, 6 Drawing Sheets

| PLACE OF DAMAGE | NONE | 12a | 12b | 12c |
|---|---|---|---|---|
| NODE POTENTIAL | V1>Vp3>V2<br>V3>Vp2>V4 | V2>Vp3<br>V4>Vp2 | Vp3>V1<br>V4>Vp2 | Vp3>V1<br>Vp2>Vp3 |
| Co1 | H | H | L | L |
| Co2 | H | L | H | H |
| Co3 | H | H | H | L |
| Co4 | H | L | L | H |

(COMPARATIVE OUTPUT: Co1–Co4)

FIG. 6

SEMICONDUCTOR DEVICE HAVING A FUNCTION OF DETECTION BREAKAGES ON A PERIPHERY THEREOF

BACKGROUND OF THE INVENTION

1. Field of the Invention

The present invention relates to a semiconductor device having a function of detecting breakages (defect) of a semiconductor chip on a periphery of the semiconductor chip.

2. Related Art

When a semiconductor device is manufactured, by dicing a wafer having a predetermined circuit including a transistor formed thereon, individual pieces of semiconductor chips can be obtained. However, in the dicing, breakages such as chipping (uneven cut surface), a crack, and peeling of an interlayer insulating film may be caused on a periphery of the semiconductor chips. Conventionally, for detecting such breakages on the periphery of the semiconductor chips, visual inspection of the respective semiconductor chips after the dicing has been made using an optical microscope.

However, with an increase in wafer diameter and a decrease in chip size, it has become more and more difficult to carry out visual inspection on all the chips due to constraints in time. Further, even if breakages are caused on the periphery, there are cases where the breakage cannot be detected due to a limitation in resolution of the optical microscope.

As a countermeasure, Japanese Patent Application Laid-open Nos. Hei 7-193108, 2005-277338, and 2000-31230 disclose semiconductor chips whose breakage on a periphery caused after dicing can be electrically detected. In Japanese Patent Application Laid-open Nos. Hei 7-193108, 2005-277338, and 2000-31230, a conductive layer such as a wiring is provided on the periphery of the semiconductor chip. When a crack is caused on the periphery of the semiconductor chip, because the conductive layer is broken by the crack, the crack can be detected as an electrical characteristic.

For example, Japanese Patent Application Laid-open Nos. Hei 7-193108 and 2005-277338 each disclose a semiconductor device including a wiring having pads connected to both ends thereof and disposed along the periphery of the semiconductor chip, which can judge a quality of the semiconductor chip by reading a change in resistance between the pads. More specifically, by reading the resistance of the wiring disposed along the periphery, breakages such as chipping of a semiconductor device can be finely detected. However, it is necessary to prepare pads and terminals for a package connected to the pads, and to prepare an external tester or the like for measuring the resistance between the pads, which increases a cost for an inspection of chipping and the like of the semiconductor device.

Further, Japanese Patent Application Laid-open No. 2000-31230 discloses a semiconductor device which includes a wiring disposed along the periphery of the semiconductor chip and which has a detection signal generating means connected to one end of the wiring (more specifically, the detection signal generating means is grounded) and an enable signal generating means connected to the other end of the wiring, for picking up a change in voltage when the semiconductor chip is chipped.

According to the semiconductor device described above, because the enable signal generating means is incorporated therein, no pad and tester for a test are necessary, which hardly increases the cost of the inspection of the semiconductor device. However, the enable signal generating means only binarily judges whether the wiring is connected or disconnected using a logic circuit. Therefore, it is impossible to appropriately set a threshold value for judging the quality, and there is a fear that, when the change in the resistance is minute, a non-defective product is erroneously judged as a defective product.

Meanwhile, in recent years, there is a case where interlayer insulating films of a semiconductor device are formed of different insulating materials in a lower layer portion and an upper layer portion. For example, the upper layer portion where a length of the wiring is relatively large and thus is liable to be influenced by parasitic capacitance is sometimes formed of an insulating material having a dielectric constant lower than that of the lower layer portion, such as a low dielectric constant material, in order to decrease the parasitic capacitance.

Peeling is more liable to occur at an interface between such interlayer insulating films formed of different insulating materials compared with an interface between interlayer insulating films formed of the same insulating material. Therefore, in a semiconductor device including a plurality of interlayer insulating films formed of different insulating materials, it is required to detect peeling caused by dicing at an interface between the interlayer insulating films with high accuracy.

In order to meet the requirement, Japanese Patent Application No. 2006-131610 filed by the same applicant as the present invention discloses a semiconductor device having a circuit forming region, the semiconductor device including a semiconductor substrate, a first interlayer insulating film formed on the semiconductor substrate and made of a first insulating material, a second interlayer insulating film formed on the first interlayer insulating film and made of a second insulating material different from the first insulating material, and a wiring structure disposed outside the circuit forming region and including a conductive plug, in which the wiring structure penetrates an interface between the first interlayer insulating film and the second interlayer insulating film.

SUMMARY

The present invention seeks to solve one or more of the above problems, or to improve upon those problems at least in part.

In one embodiment, a semiconductor device includes a resistance wiring disposed on a periphery of a semiconductor chip, one end of the resistance wiring being connected to a first power supply and the other end of the resistance wiring being connected to a second power supply, and a judgement circuit for judging a potential in a middle of a path of the resistance wiring.

In one embodiment, because the judgement circuit for judging a change in resistance of the resistance wiring disposed on the periphery is incorporated in the semiconductor device, no dedicated pad or the like is necessary, and, when the change in resistance is minute, the semiconductor device can be determined as a non-defective product. Therefore, the yield of the semiconductor device can be improved at a low cost.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposes.

A semiconductor device according to an embodiment of the present invention includes a resistance wiring (12 of FIG. 1) and a judgement circuit (14 of FIG. 1) for judging potential midway through a path of the resistance wiring. The resistance wiring is provided on the periphery of a semiconductor chip (11 of FIG. 1). One end of the resistance wiring is connected to a first power supply (Vcc of FIG. 1) and the other end of the resistance wiring is connected to a second power supply (for example, the other end is grounded). It is preferable that connection points of the resistance wiring to the first and second power supplies are disposed in one of four corners on the periphery of the semiconductor chip (corner P1 of FIG. 1) while a connection point of the resistance wiring to the judgement circuit is disposed in a corner diagonal to the one corner on the periphery (corner P2 of FIG. 1). A switching element is included midway through the path of the resistance wiring for opening/closing the path. It is preferable that the switching element is normally open in order to decrease the power consumption of the semiconductor device and is controlled to close the path only when the judgement circuit is operated.

In the semiconductor device structured as in the above, when chipping (B of FIG. 1), peeling of an interlayer insulating film, or the like is caused on the periphery, the resistance of the resistance wiring changes. The judgement circuit makes a judgement based on the change in the resistance of the resistance wiring. When the change in the resistance is equal to or more than a predetermined level, the judgement circuit judges that the semiconductor device is a defective product, while when the change in the resistance is minute, the judgement circuit can judge that the semiconductor device is a non-defective product. Therefore, it is prevented to erroneously judge a non-defective product to be a defective product when the change in the resistance is minute and the yield of the semiconductor device is improved. Embodiments of the present invention are described in further detail in the following with reference to the attached drawings.

Figure 1:
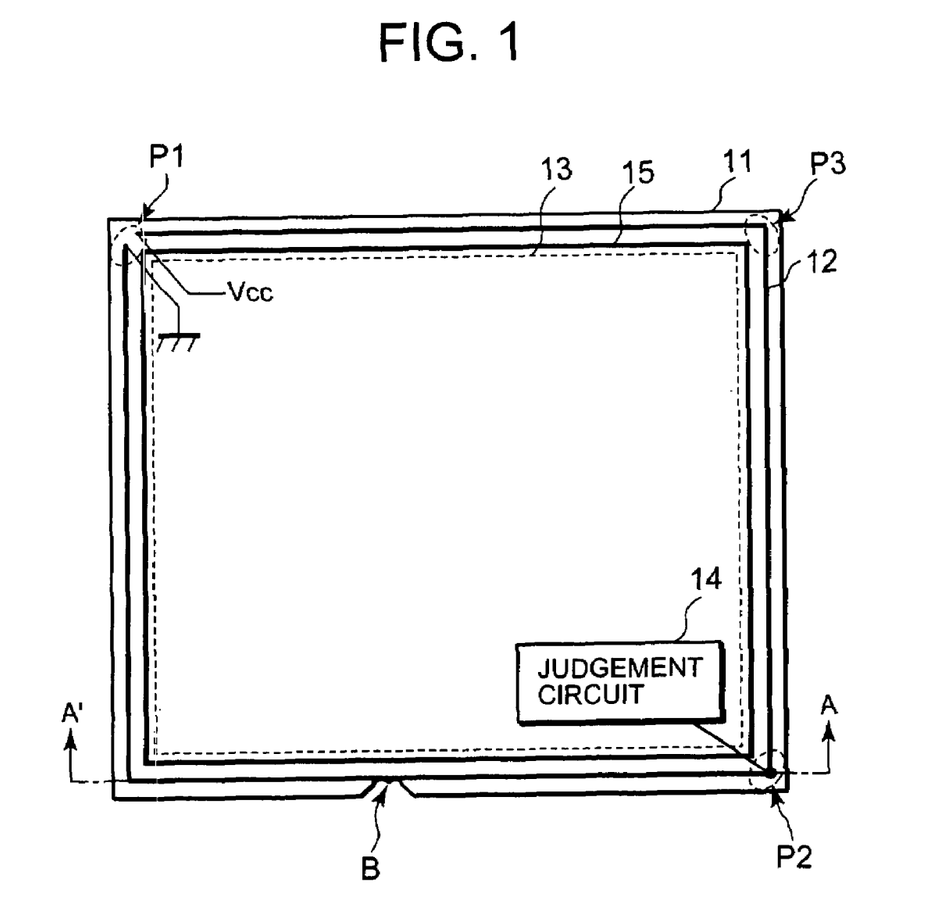
FIG. 1 is a schematic view illustrating a structure of a semiconductor device according to an embodiment of the present invention.

FIG. 1 is a schematic view illustrating a structure of a semiconductor device according to an embodiment of the present invention. In FIG. 1, the semiconductor chip 11 includes the resistance wiring 12 disposed on the periphery thereof and a seal ring (guard ring) 15 inside the resistance wiring 12. The judgement circuit 14 and an internal circuit (not shown) are formed in an internal region 13 inside the seal ring 15. One end of the resistance wiring 12 is connected to the power supply Vcc while the other end of the resistance wiring 12 is grounded. Connection points of the one end and the other end of the resistance wiring 12 are disposed in the corner P1 which is one of the four corners on the periphery of the semiconductor chip 11. A connection point of the resistance wiring 12 to the judgement circuit 14 is disposed in the corner P2 which is a corner diagonal, to the corner P1 on the periphery. The judgement circuit 14 measures the potential at the connection point of the resistance wiring 12 in the corner P2, and judges whether the potential is within a predetermined range or not.

It is to be noted that, although not shown of FIG. 1, as described in the following, another judgement circuit may be further provided, and a connection point of the judgement circuit to the resistance wiring 12 may be disposed in a corner P3 on the periphery which is different from the corners P1 and P2. Further, the place where the connection points of the resistance wiring 12 to the power supply Vcc and to the ground are disposed is not necessarily limited to a corner. Similarly, the place where the connection point to the judgement circuit is disposed is not necessarily limited to a corner. However, generally, it is often the case that no circuit is disposed at places in the internal region 13 adjacent to corners. Therefore, by disposing the judgement circuit and the like, which are not necessary for ordinary operation, at places in the internal region 13 adjacent to corners, other circuits are not interrupted and thus, layout efficiency of the circuits is improved. Accordingly, it is desirable that the connection point to the judgement circuit be disposed in a corner.

Figure 2:
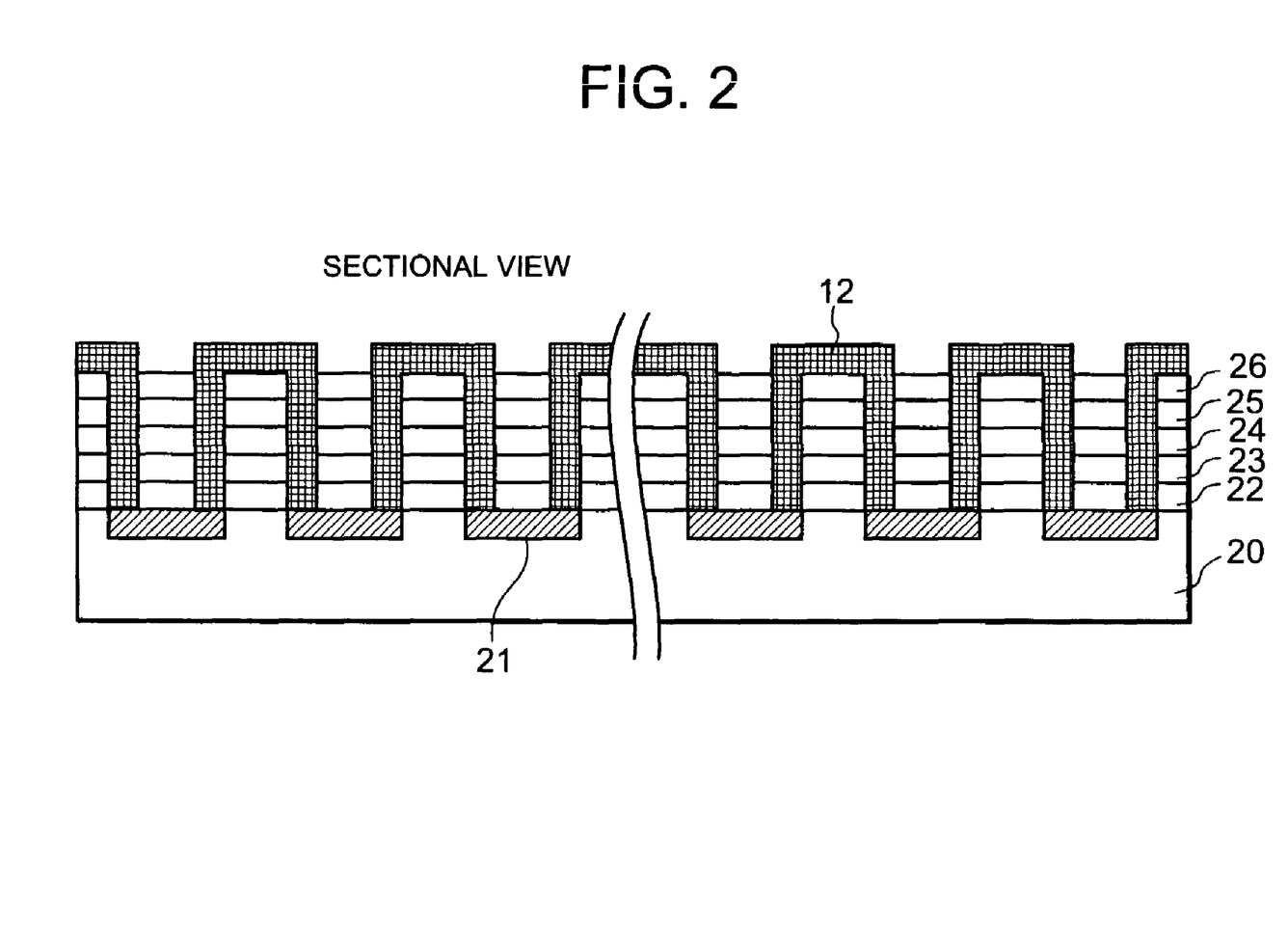
FIG. 2 is a sectional view taken along the line A-A' of FIG. 1, which illustrates a structure of a resistance wiring.

Next, the resistance wiring is described in detail. FIG. 2 is a sectional view taken along the line A-A' of FIG. 1 illustrating a structure of the resistance wiring. In FIG. 2, the semiconductor chip 11 includes a semiconductor substrate 20, an interlayer insulating film 22 (first interlayer insulating film), an interlayer insulating film 23 (second interlayer insulating film), and the resistance wiring 12. The semiconductor substrate 20 may be, for example, a silicon substrate.

The interlayer insulating film 22 is provided on the semiconductor substrate 20. The interlayer insulating film 22 is formed of a first insulating material. The interlayer insulating film 23 is provided on the interlayer insulating film 22. The interlayer insulating film 23 is formed of a second insulating material. The first and second insulating materials are, for example, silicon oxide and a low permittivity material, respectively, which are different insulating materials.

The resistance wiring 12 is formed on the periphery of the semiconductor chip 11. The periphery is a region outside the internal region 13 (region surrounded by a dotted line of FIG. 1) where semiconductor elements such as a transistor are formed. It is preferable that the periphery be a region which is within 100 μm from diced surfaces of the semiconductor chip 11. In other words, it is preferable that the resistance wiring 12 be provided in a region which is within 100 μm from the diced surfaces of the semiconductor chip 11. The seal ring (guard ring) 15 is also formed on the periphery so as to surround the internal region 13. The resistance wiring 12 is provided outside the seal ring 15.

The resistance wiring 12 includes a conductive plug. The conductive plug is connected to a diffusion layer 21 of the semiconductor substrate 20. The resistance wiring 12 penetrates an interface between the interlayer insulating film 22 and the interlayer insulating film 23 and is formed as a via chain. The via chain extends over substantially the whole periphery of the internal region 13. It is to be noted that the via chain and the seal ring 15 are electrically insulated from each other.

An interlayer insulating film 24, an interlayer insulating film 25, and an interlayer insulating film 26 are laminated in this order on the interlayer insulating film 23. The material of the interlayer insulating films 24, 25, and 26 is the second insulating material mentioned above.

In the semiconductor chip 11, the resistance wiring 12 is provided on the periphery outside the internal region 13. The resistance wiring 12 penetrates the interface between the interlayer insulating film 22 and the interlayer insulating film 23 which are formed of different insulating materials. Therefore, when peeling is caused at the interface which in turn causes a crack or a breakage of the resistance wiring 12, peeling can be converted into change in the electrical characteristics. Such change in the electrical characteristics includes change in the resistance of the resistance wiring 12.

Therefore, even when peeling is caused at the interface by dicing or the like, the peeling can be accurately detected. The detection can be made not only before the semiconductor chip 11 is shipped as a product but also after the semiconductor chip 11 is shipped. Therefore, not only peeling caused during manufacture (especially in dicing) but also peeling caused after manufacture can be detected.

Further, the first and second insulating materials have different permittivities. Peeling is more liable to occur at an interface between such interlayer insulating films having different permittivities (between the interlayer insulating film 22 and the interlayer insulating film 23). Therefore, peeling caused at the interface can be accurately detected using change in the resistance of the resistance wiring 12.

The resistance wiring 12 is formed as a via chain. This makes it possible to materialize the resistance wiring 12 of a simple structure which is extending along the periphery of the internal region 13. In particular, the via chain extends over substantially the whole periphery of the internal region 13. Therefore, peeling caused at any point on the periphery of the internal region 13 can be accurately detected.

Figure 3:
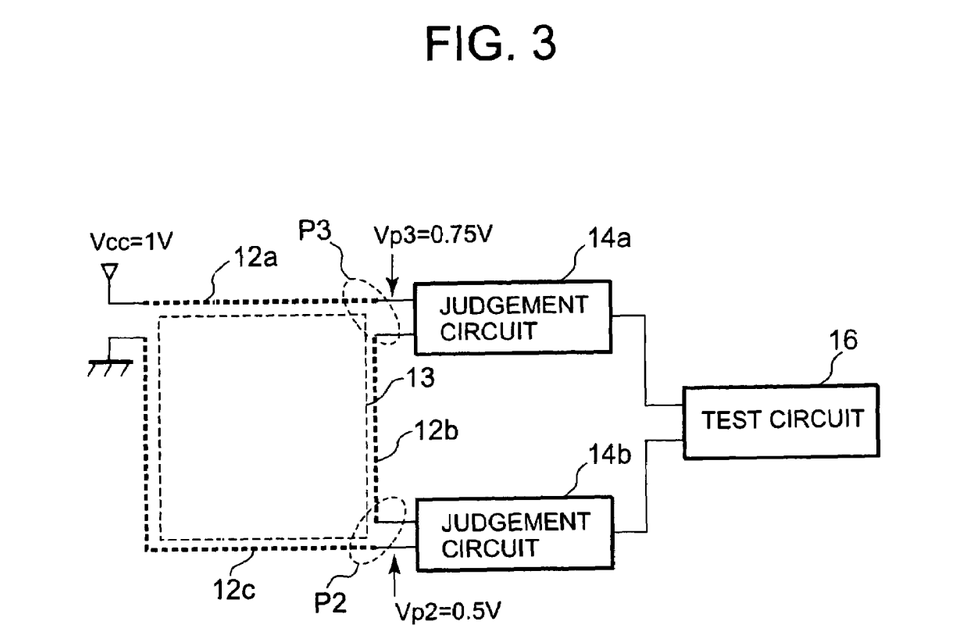
FIG. 3 is a block diagram illustrating a structure of judgement circuits and a periphery thereof.

Next, the judgement circuit is described in detail. FIG. 3 is a block diagram illustrating a structure of judgement circuits and an area adjacent to the judgement circuits. In FIG. 3, the semiconductor chip 11 is square-shaped and the potential of the power supply Vcc is 1 V. The semiconductor chip 11 includes a judgement circuit 14a for judging the potential at the corner P3 of FIG. 1, a judgement circuit 14b for judging the potential at the corner P2 of FIG. 1, and a test circuit 16 for controlling the judgement circuits 14a and 14b. The result of the judgement made by the judgement circuits 14a and 14b are inputted to the test circuit 16. The resistance wiring 12 of FIG. 1 is formed of three resistance wirings: a resistance wiring 12a between the power supply Vcc and the corner P3; a resistance wiring 12b between the corner P3 and the corner P2; and a resistance wiring 12c between the corner P2 and the ground. When all of the three resistance wirings are not damaged and the resistances thereof show normal values, because the power supply Vcc is 1 V, a potential Vp3 at a connection point between the resistance wiring 12a and the resistance wiring 12b in the corner P3 is 0.75 V, while a potential Vp2 at a connection point between the resistance wiring 12b and the resistance wiring 12c in the corner P2 is 0.5 V.

When the resistance wiring is tested, the judgement circuit 14a judges whether the potential Vp3 is within a predetermined range (for example, 0.65 to 0.85 V) or not and outputs the result of the judgement to the test circuit 16, while the judgement circuit 14b judges whether the potential Vp2 is within a predetermined range (for example, 0.4 to 0.6V) or not and outputs the result or the judgement to the test circuit 16. Suppose that both the resistance wiring 12a or the resistance wiring 12b and the resistance wiring 12c suffer damage resulting in the same change in the resistance. In this case, while at the judgement circuit 14b, the potential Vp2 is 0.5 V which means no change, at the judgement circuit 14a, the outputted result of the judgement shows that the potential Vp3 is out of the predetermined range. When damage is caused to a similar extent at two places in the resistance wiring in this way, if there is only one judgement circuit, there is a case where accurate judgement cannot be made, but, by providing such two judgement circuits, judgement that there is damage can be made.

Figure 4:
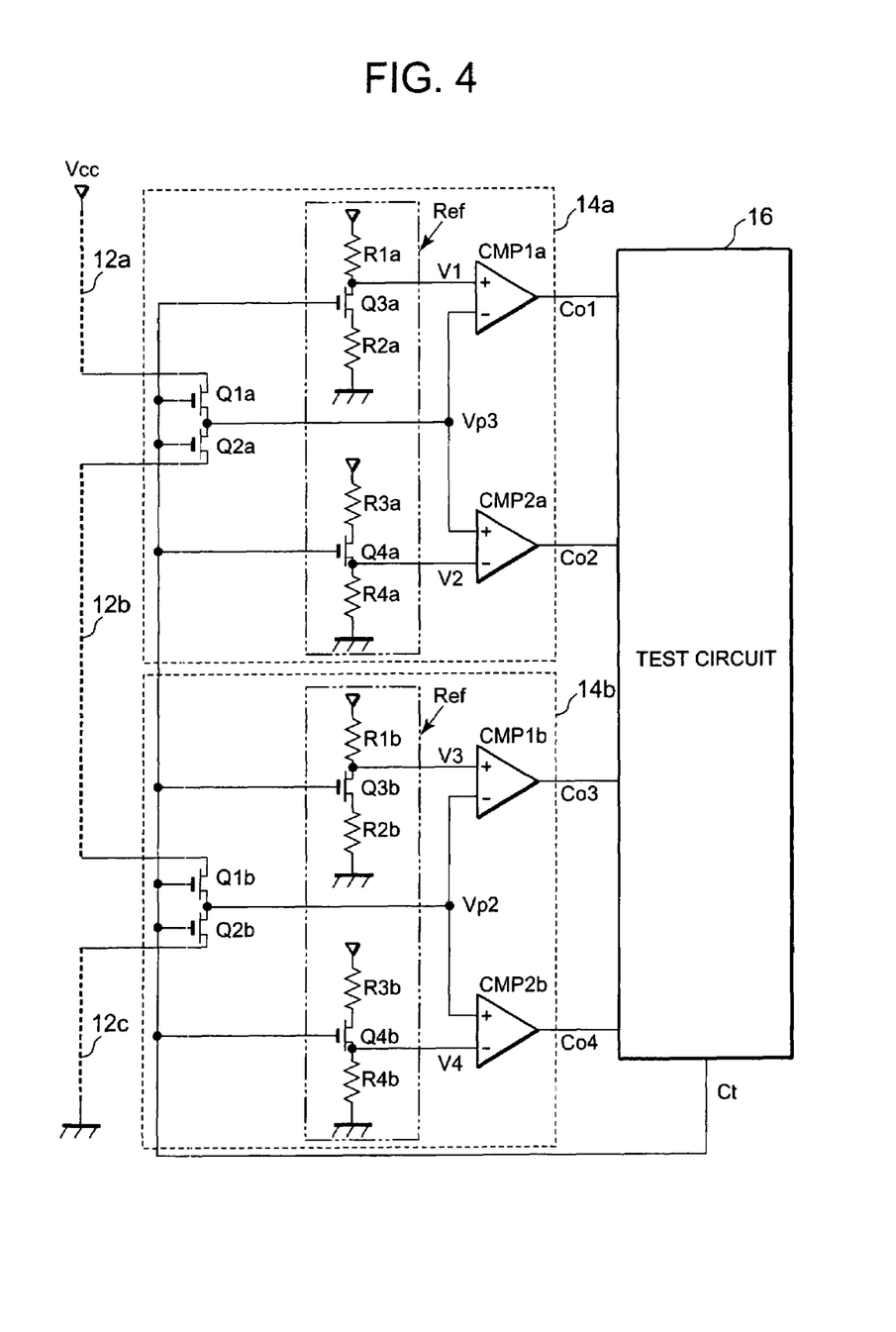
FIG. 4 is a circuit diagram of the judgement circuits.

FIG. 4 is a circuit diagram of the judgement circuits. In FIG. 4, the judgement circuit 14a includes N-channel transistors Q1a, Q2a, Q3a, and Q4a, resistances R1a, R2a, R3a, and R4a, and comparison circuits CMP1a and CMP2a. Similarly, the judgement circuit 14b includes N-channel transistors Q1b, Q2b, Q3b, Q4b, resistances R1b, R2b, R3b, R4b, and comparison circuits CMP1b and CMP2b. Because the structure of the judgement circuit 14b is the same as that of the judgement circuit 14a, the judgement circuit 14a is mainly described in the following.

A first controlled terminal of the N-channel transistor Q1a is connected to one end of the resistance wiring 12a whose other end is, connected to the power supply Vcc. A first controlled terminal of the N-channel transistor Q2a is connected to one end of the resistance wiring 12b. A first controlled terminal of the N-channel transistor Q1b is connected to the other end of the resistance wiring 12b. A first controlled terminal of the N-channel transistor Q2b is connected to one end of the resistance wiring 12c whose other end is grounded. Second controlled terminals of the N-channel transistors Q1a and Q2a are together connected to a second input terminal (−) of the comparison circuit CMP1a and a first input terminal (+) of the comparison circuit CMP2a. A test signal Ct is supplied from the test circuit 16 to gates of the N-channel transistors Q1a, Q2a, Q1b, and Q2b. The test signal Ct is at HIGH level when a resistance wiring is tested.

When a resistance wiring is tested, the N-channel transistors Q1a, Q2a, Q1b, and Q2b are turned on. When there is no damage to the resistance wiring, current flows through the resistance wirings 12a, 12b, and 12c, and potential Vp3 of 0.75 V is generated at the second input terminal (−) of the comparison circuit CMP1a and at the first input terminal (+) of the comparison circuit CMP2a (in the judgement circuit 14b, potential Vp2 of 0.5 V is generated). It is to be noted that, in normal operation, the N-channel transistors Q1a, Q2a, Q1b, and Q2b are off to prevent power consumption from being increased due to current through the resistance wiring. Further, the N-channel transistors Q1a and Q2a function as double pole switches such that the potential Vp3 is not fluctuated when the transistors are turned on due to on resistance.

One end of the resistance R1a is connected to the power supply Vcc. The other end of the resistance R1a is connected to a drain of the N-channel transistor Q3a and to a first input terminal (+) of the comparison circuit CMP1a. A source of the N-channel transistor Q3a is grounded through the resistance R2a. Further, a drain of the N-channel transistor Q4a is connected to the power supply Vcc through the resistance R3a. A source of the N-channel transistor Q4a is connected to one end of the resistance R4 whose other end is grounded and to a second input terminal (−) of the comparison circuit CMP2a. The test signal Ct is supplied from the test circuit 16 to gates of the N-channel transistors Q3a and Q4a. The test signal Ct is at HIGH level when a resistance wiring is tested. The N-channel transistors Q3a and Q4a and the resistances R1a, R2a, R3a, and R4a form a reference voltage generating circuit Ref.

When a resistance wiring is tested, the N-channel transistors Q3a and Q4a are turned on to generate potential V1 of, for example, 0.85 V at the first input terminal (+) of the comparison circuit CMP1a and to generate potential V2 of, for example, 0.65 V at the second input terminal (−) of the comparison circuit CMP2a. On the other hand, in the judgement circuit 14b, potential V3 of, for example, 0.6 V is generated at a first input terminal (+) of the comparison circuit CMP1b and potential V4 of, for example, 0.4 V is generated at a second input terminal (−) of the comparison circuit CMP2b. It is to be noted that, in normal operation, the N-channel transistors Q3a and Q4a are off to prevent power consumption from being increased due to current through the resistance wiring.

The test circuit 16 outputs the test signal Ct to the judgement circuits 14a and 14b. The test signal Ct is at LOW level in normal operation and is at HIGH level when a resistance wiring is tested. Output signals Co1, Co2, Co3, and Co4 from the comparison circuits CMP1a and CMP2a in the judgement circuit 14a and from the comparison circuits CMP1b and CMP2b in the judgement circuit 14b are inputted to the test circuit 16 to judge whether the resistance wiring is damaged or not.

Figure 5:
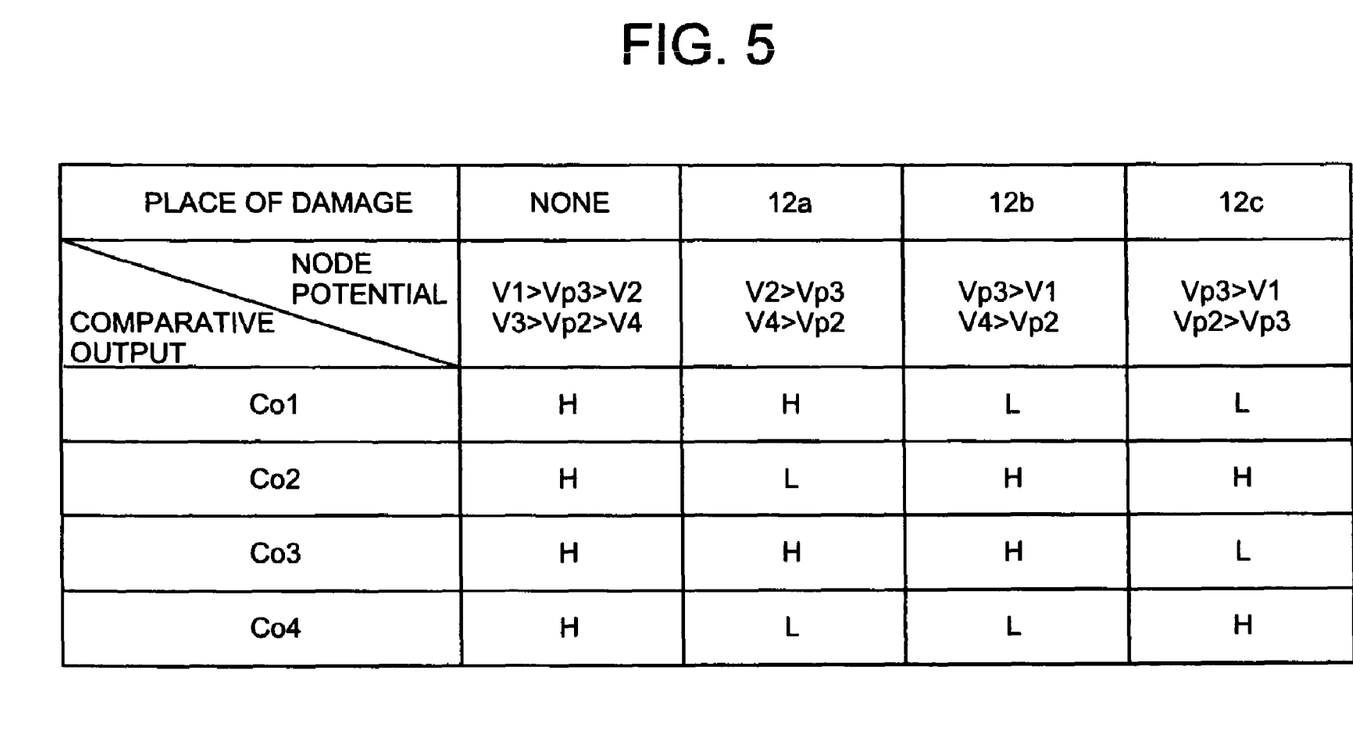
FIG. 5 is a diagram illustrating a logic input in a test circuit at a time of judgement of defect of the resistance wiring.

FIG. 5 illustrates logic input in the test circuit when it is judged whether the resistance wiring is damaged or not. In FIG. 5, the following logic input is inputted to the test circuit 16 according to the place of the damage in the resistance wiring.

(1) When there is no damage (only extremely minute damage) to any of the resistance wirings 12a, 12b, and 12c, V1>Vp3>V2 and V3−Vp2>V4, and all the output signals Co1, Co2, Co3, and Co4 are at HIGH level.

(2) When there is damage to the resistance wiring 12a, V2>Vp3 and V4>Vp2 (when the resistance wiring 12a is completely disconnected, Vp3=0 V and Vp2=0 V), and the output signals Co1, Co2, Co3, and Co4 are at HIGH level, LOW level, HIGH level, and LOW level, respectively.

(3) When there is damage to the resistance wiring 12b, Vp3>V1 and V4>Vp2 (when the resistance wiring 12b is completely disconnected, Vp3=Vcc V and Vp2=0 V), and the output signals Co1, Co2, Co3, and Co4 are at LOW level, HIGH level, HIGH level, and LOW level, respectively.

(4) When there is damage to the resistance wiring 12c, Vp3>V1 and Vp2>V3 (when the resistance wiring 12c is completely disconnected, Vp3=Vcc and Vp2=Vcc), and the output signals Co1, Co2, Co3, and Co4 are at LOW level, HIGH level, LOW level, and HIGH level, respectively.

As described above, logic outputted from the judgement circuits 14a and 14b changes according to the place of the damage in the resistance wiring and the extent of the damage. Therefore, the test circuit 16 can judge whether the resistance wiring is damaged or not using the logic outputted from the judgement circuits 14a and 14b. Further, by setting the potentials V1 to V4 such that the logic outputted from the judgement circuits 14a and 14b is not fluctuated by minute change in the resistance of the resistance wiring, it can be prevented to erroneously judge a non-defective product to be a defective product when the damage to the resistance.

Figure 6:
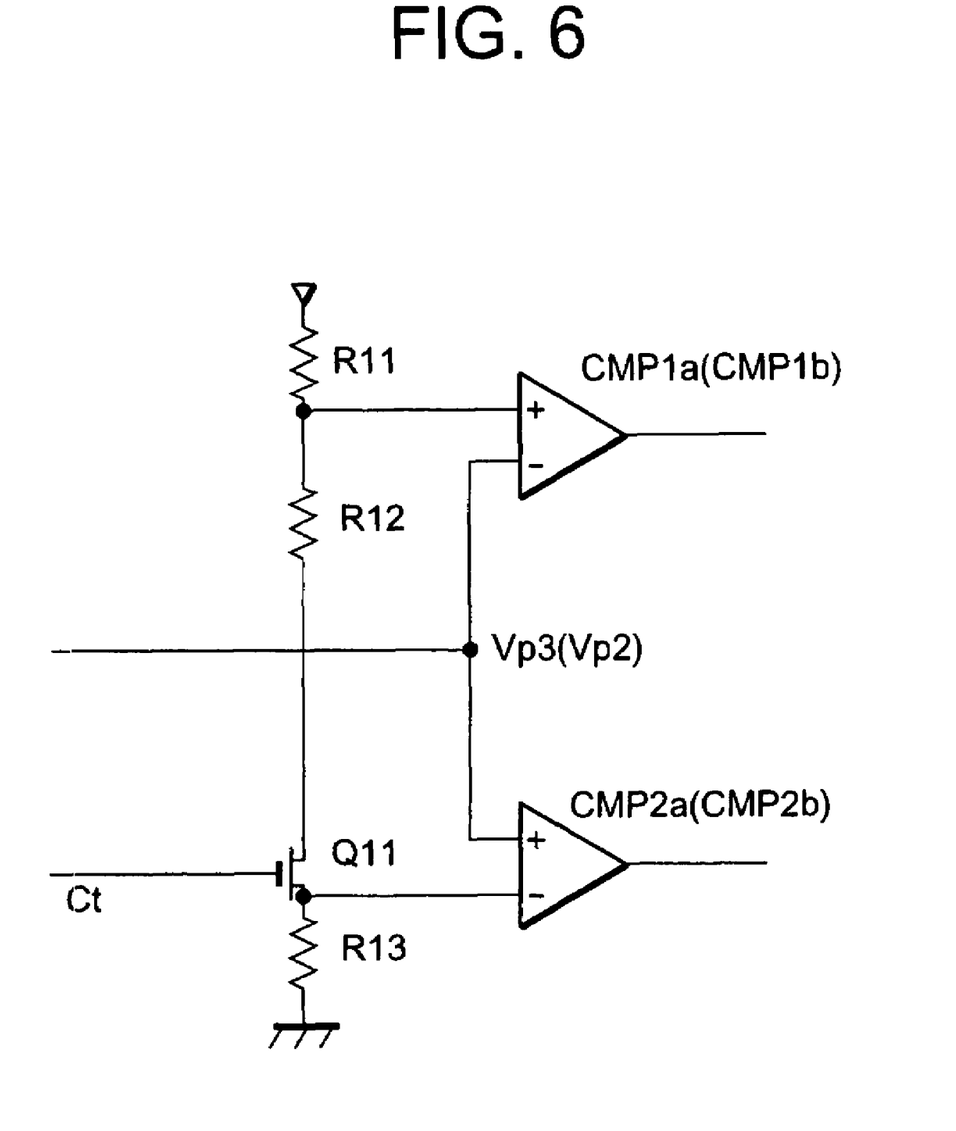
FIG. 6 is a circuit diagram illustrating another structure of a reference voltage generating circuit.

FIG. 6 is a circuit diagram illustrating another structure of the reference voltage generating circuit. In FIG. 6, a reference voltage generating circuit includes an N-channel transistor Q11 and resistances R11, R12, and R13. The resistances R11 and R12, the N-channel transistor Q11, and the resistance R13 are in cascade connection between a power supply Vcc and the ground. A connection node between the resistances R11 and R12 is connected to a first input terminal (+) of a comparison circuit CMP1a (CMP1b). A connection node between a source of the N-channel transistor Q11 and the resistance R13 is connected to a second input terminal (−) of a comparison circuit CMP2a (CMP2b). A test signal Ct is supplied to a gate of the N-channel transistor Q11 such that the N-channel transistor Q11 is turned on when a resistance wiring is tested.

The reference voltage generating circuit structured as described above has a function equivalent to that of the reference voltage generating circuit Ref illustrated of FIG. 4. However, it has only one N-channel transistor and three resistance, and the structure of the circuit is simple.

The descriptions have been made of the embodiments of the present invention above. However, it is apparent that the present invention is not limited to the above embodiments, but may be modified and changed without departing from the scope and spirit of the invention.

What is claimed is:

1. A semiconductor device, comprising:
   a resistance wiring disposed along a periphery of a semiconductor chip, one end portion of the resistance wiring being connected to one pad of a pair of pads connecting to a first power supply to supply a first potential and the other end portion of the resistance wiring being connected to another pad of the pair of pads connecting to a second power supply to supply a second potential; and
   a first judgement circuit judging a potential at a first intermediate portion of the resistance wiring between the one and other end portion, and outputting a result of judgement that the resistance wiring is abnormal when the potential at the first intermediate portion is not between a third potential and a fourth potential.

2. A semiconductor device according to claim 1, wherein:
   the first intermediate portion is provided at one of four corners on the periphery of the semiconductor chip; and
   connection points of the resistance wiring to the pair of pads are disposed at a corner diagonal to the one of four corners.

3. A semiconductor device according to claim 1, further comprising a second judgement circuit judging a potential at a second intermediate portion different from the first intermediate portion of the resistance wiring; and outputting a result of the judgement that the resistance wiring is abnormal when the potential at the second intermediate portion is not between a fifth potential and a sixth potential different from the third potential and the fourth potential.

4. A semiconductor device according to claim 3, wherein:
   connection points of the resistance wiring to the pair of pads are disposed at a first corner of four corners on the periphery of the semiconductor chip;
   the first intermediate portion is disposed at a second corner diagonal to the first corner of four corners; and
   the second intermediate portion is disposed in one of the four corners other than the first corner and the second corner.

5. A semiconductor device according to claim 1, further comprising a switching circuit in the middle of the path of the resistance wiring, opening and closing the path,
   wherein the switching circuit is controlled to close the path when the first judgment circuit is operated.

6. A semiconductor device according to claim 1, wherein: the semiconductor chip comprises:
   a first interlayer insulating film formed on the semiconductor chip and formed of a first insulating material;

a second interlayer insulating film formed on the first interlayer insulating film and formed of a second insulating material different from the first insulating material; and a circuit forming region; and the resistance wiring is provided on the periphery outside the circuit forming region, has a wiring structure including a conductive plug, and penetrates an interface between the first interlayer insulating film and the second interlayer insulating film.

7. A semiconductor device according to claim 6, wherein the wiring structure is structured as a via chain that extends along the periphery.

8. A semiconductor device according to claim 7, wherein the via chain extends substantially over the whole periphery.

9. A semiconductor device according to claim 6, further comprising a seal ring surrounding the circuit forming region, wherein the wiring structure is provided outside the seal ring.

10. A semiconductor device according to claim 1, wherein either potential of the first or second potential is ground potential.

* * * * *